United States Patent [19]
Chang et al.

[11] Patent Number: 5,753,529
[45] Date of Patent: May 19, 1998

[54] SURFACE MOUNT AND FLIP CHIP TECHNOLOGY FOR TOTAL INTEGRATED CIRCUIT ISOLATION

[75] Inventors: Mike F. Chang, Cupertino; King Owyang, Atherton; Fwu-Iuan Hshieh, San Jose; Yueh-Se Ho, Sunnyvale; Jowei Dun, San Jose, all of Calif.

[73] Assignee: Siliconix incorporated, Santa Clara, Calif.

[21] Appl. No.: 444,660

[22] Filed: May 19, 1995

Related U.S. Application Data

[63] Continuation of Ser. No. 238,552, May 5, 1994, abandoned.
[51] Int. Cl.⁶ .................................................. H01L 21/302
[52] U.S. Cl. .......................... 437/67; 437/226; 437/902; 148/DIG. 135
[58] Field of Search .............................. 437/67, 68, 61, 437/209, 226, 902, 974; 148/DIG. 135

[56] References Cited

U.S. PATENT DOCUMENTS

| | | | |
|---|---|---|---|
| 3,761,782 | 9/1973 | Youmans | 257/778 |
| 4,972,250 | 11/1990 | Omori et al. | 357/54 |
| 4,978,639 | 12/1990 | Hua et al. | 148/DIG. 135 |
| 5,091,331 | 2/1992 | Delgado et al. | 437/62 |
| 5,158,911 | 10/1992 | Quentin | 437/209 |
| 5,170,930 | 12/1992 | Dolbear et al. | 228/123 |
| 5,229,643 | 7/1993 | Ohta et al. | 257/706 |
| 5,270,261 | 12/1993 | Bertin | 437/974 |
| 5,272,104 | 12/1993 | Schrantz et al. | 437/63 |
| 5,352,926 | 10/1994 | Andrews | 257/717 |
| 5,426,072 | 6/1995 | Finnila | 437/208 |
| 5,434,094 | 7/1995 | Kobiki et al. | 437/902 |
| 5,444,009 | 8/1995 | Richards et al. | 148/DIG. 135 |
| 5,447,871 | 9/1995 | Goldstein | 437/974 |
| 5,480,832 | 1/1996 | Miura et al. | 437/67 |

FOREIGN PATENT DOCUMENTS

| | | |
|---|---|---|
| 55-59754 | 5/1980 | Japan. |
| 1-295455 | 11/1989 | Japan. |

*Primary Examiner*—Kevin Picardat
*Attorney, Agent, or Firm*—Skjerven, Morrill, MacPherson, Franklin & Friel; Norman R. Klivans

[57] ABSTRACT

An integrated circuit chip has full trench dielectric isolation of each portion of the chip. Initially the chip substrate is of conventional thickness and has semiconductor devices formed in it. After etching trenches in the substrate and filling them with dielectric material, a heat sink cap is attached to the passivation layer on the substrate front side surface. The substrate backside surface is removed (by grinding or CMP) to expose the bottom portion of the trenches. This fully isolates each portion of the die and eliminates mechanical stresses at the trench bottoms. Thereafter drain or collector electrical contacts are provided on the substrate backside surface. In a flip chip version, frontside electrical contacts extend through the frontside passivation layer to the heat sink cap. In a surface mount version, vias are etched through the substrate, with surface mount posts formed on the vias, to contact the frontside electrical contacts and provide all electrical contacts on the substrate backside surface. The wafer is then scribed into die in both versions without need for further packaging.

7 Claims, 17 Drawing Sheets

SURFACE MOUNT AND FLIP CHIP TECHNOLOGY FOR TOTAL INTEGRATED CIRCUIT ISOLATION

This application is a continuation of application Ser. No. 08/238,552, filed May 5, 1994 now abandoned.

BACKGROUND OF THE INVENTION

1. Field of the Invention

This invention relates to integrated circuit electrical isolation, and more specifically to integrated circuit total isolation using both surface mount and flip chip fabrication technologies.

2. Description of the Prior Art

Dielectric isolation for integrated circuits is well known. A trench or groove is formed in the semiconductor chip substrate and is lined or filled with an insulative material, to electrically isolate various portions of the chip. For instance, a particular portion of the chip such as power (high voltage) transistors is surrounded by an insulated trench, thereby electrically isolating the power transistors from logic type (low voltage) transistors.

This prior art trench isolation has the significant disadvantage that the bottom of each trench is an area of substantial mechanical stress in the silicon substrate, thereby being detrimental to chip functionality. Such trenches thus reduce yield (increase cost). This deficiency is sometimes overcome by using "round hole" techniques to form the bottom of each trench (providing a U-shaped rather than a rectangular cross-section) which however, also tends to increase cost.

Another method for achieving isolation uses two wafers, with an oxide layer formed on a surface of one wafer which is then bonded to the second wafer; the oxide layer provides the isolation. After bonding the two wafers, the backside of one of the wafers is polished away down to the oxide layer to isolate a portion of the remaining substrate. However, this is very expensive because there can be no defects in the bond between the two wafers. Defects are often induced by particles in the bond between the two wafers, causing low production yield and hence high cost. Also, oxidation induced stacking faults (OISF) due to processing temperature cycles are undesirably more pronounced in such a bond than in bulk silicon.

Therefore, the prior art is deficient in not providing practical and inexpensive dielectric isolation, especially for use with power transistors but also for other types of integrated circuits.

SUMMARY OF THE INVENTION

An integrated circuit structure and a fabrication method use trench dielectric isolation. This trench dielectric isolation is part of a chip fabrication process which allows the packaging for each chip to be formed on the wafer, thereby eliminating the prior art separate step of packaging a semiconductor die after the wafer is scribed into multiple die. Therefore the disclosed process is the equivalent of assembly or packaging the integrated circuit die at "waferscale", since each die is already packaged before the wafer is scribed.

In accordance with the invention, transistors (or other semiconductor devices) are conventionally fabricated on a semiconductor substrate. Some of these devices may be power transistors (operating at high voltage) and others may be lower voltage logic-type transistors formed in another portion of the substrate. In one embodiment, the devices are field effect transistors having gate electrodes formed in an insulated layer overlying the principal surface of the semiconductor substrate.

Alternatively, the transistors are IGBT's (insulated gate bipolar transistors), or bipolar transistors, or other semiconductor devices. The process technology may be a CMOS, NMOS, PMOS, DMOS, BiCMOS, or bipolar technology, for example. The process technology may be lateral DMOS that provides all active device contacts (source, drain, gate) on the same surface of the substrate. Then an interconnect pattern is conventionally formed overlying and interconnecting the gate electrodes (or other transistor elements), and for contacting the semiconductor regions (e.g. source and drain) formed in the substrate.

A plurality of insulated trenches are then formed penetrating the principal surface of the substrate into the depth thereof, and surrounding (in a top view) various portions of the substrate. The trenches are conventionally insulated by filling or lining them with an insulative material followed by a planarization step. This step may be prior to the metallization step to achieve electrical contact. Then a portion of the backside of the substrate is removed by conventional machining or chemical processes, exposing the bottom portion of each of the trenches, and thereby achieving full (total) electrical isolation of the various substrate portions surrounded by each trench.

Prior to the step of removing the backside portion of the substrate, the frontside surface is bonded to a heat sink cap or plate (made for instance of silicon) using epoxy or similar bonding materials. This heat sink cap also provides the needed mechanical support for the substrate, which is otherwise quite thin following the substrate removal step.

Electrical contact (metallization) is achieved in two different embodiments. In a surface mount embodiment, vias penetrate from the backside surface of the substrate to its principal (frontside) surface, allowing electrically conductive material formed in the vias to contact an interconnect structure already formed on the substrate frontside surface. Extensions of the vias on the substrate backside define posts for surface mount electrical contacts. Other similar posts formed on the backside surface of the substrate make contact to the bulk substrate. The heat sink cap attached to the frontside substrate surface has a mechanical and heat dissipation function, with no electrical connections provided thereby.

In a flip chip type embodiment, the heat sink cap also carries on it an electrical interconnect, making electrical contact to the conventional interconnect on the substrate frontside surface. A conventional flip chip backplate is attached to this heat sink cap. In this embodiment the electrical contacts formed on the substrate backside surface are the conventional drain or collector contacts for e.g. power integrated circuits.

In both embodiments, the individual integrated circuits are packaged while still being part of a single wafer, by the application of the heat sink cap which is attached (by epoxy or other adhesive) to the wafer frontside surface. This cap replaces the conventional plastic or ceramic packaging which in the prior art is applied only after the wafer is scribed into individual die. In the present case the full trench isolation between the die allows the die to be scribed adjacent to the isolation trenches, together with the attached heat sink cap, so that no further packaging is needed.

Typically, the thickness of the substrate after the substrate removal step is less than about 50 micrometers (but may be less than about 300 micrometers, or more). This very thin substrate is free of heat induced mechanical stresses, due to its mechanical flexibility. Advantageously, integrated circuit chips in accordance with the invention are inexpensively fabricated using essentially conventional steps which provide a high yield, thus reducing cost.

The dielectric isolation trenches may conventionally be lined, for instance with silicon dioxide (formed from the silicon trench walls), or may be completely filled with silicon dioxide, or may be lined with silicon dioxide and then filled with another material such as CVD (chemical vapor deposition) nitride or oxide or alternatively a polysilicon or amorphous polysilicon layer. In another embodiment, the trenches are filled with conventional spun on glass. Other insulating materials may be used for the trench dielectric.

The heat sink cap (plate) is typically silicon, silicon carbide, silicon nitride, aluminum nitride, molybdenum, or other material which provides sufficient heat transfer and is conveniently fabricated. The removal of the backside of the substrate advantageously eliminates mechanical stresses normally present at the bottom of a trench formed in silicon. Thus the principal problem with prior art trench isolation is overcome, resulting in a thin, flexible substrate.

Also, the prior art requirement for a semiconductor buried layer in the substrate is eliminated, due to the very thin substrate and formation of a layer of conductive material on selective areas of the substrate backside surface. Thus the processing problems associated in the prior art with establishing an effective buried layer are avoided, and the parasitic bipolar transistor effects typically present in prior art integrated circuits (especially for power integrated circuits) are eliminated by a backside contact which is a metal plate or metallization layer rather than a buried semiconductor layer.

The metallized drain (or collector) contact on the backside surface, which is in relatively close proximity to the active transistors (due to the thinness of the substrate), increases current carrying capability over that of the prior art chips which require either the buried layer or current being transmitted through the relatively thick bulk of the semiconductor substrate. Thus advantageously the actual thickness of the final substrate itself is the minimum necessary to support (mechanically and electrically) the active transistor regions. This thickness may be as little as 10 microns, in contrast to prior art integrated circuits typically having a 400 micron die thickness needed for mechanical support for the integrated circuit.

Additionally, the step of removing the backside portion of the substrate after trench formation means that the initial trench depth need not be precisely determined. In the prior art, formation of trenches of precise depth is a significant processing limitation. In the present case, since the bottom portion of each trench is removed, exact trench depth is not critical.

Also, the fabrication process in accordance with the invention advantageously allows for an isolated backside contact structure which is not a single contact but a plurality of individual backside contacts, each contact associated with a particular portion of the die. This allows for instance a first backside contact to a power transistor portion of the integrated circuit, and a second backside contact associated with a low voltage transistor portion of the integrated circuit. Thus the backside contacts are selectable for a particular portion of the integrated circuit, and various portions of the chip need not share a common collector or common drain.

DETAILED DESCRIPTION OF THE INVENTION

Surface Mount Embodiment FIGS. 1 to 12 illustrate steps to fabricate a surface mount integrated circuit chip in accordance with the invention. It is understood that these are conventionally drawn cross sections of an integrated circuit showing only a small portion of the circuit, i.e. a small portion of a wafer. No topside views are provided, since the top side geometry of the integrated circuit is conventional, as will be understood by one of ordinary skill in the art from the following description. Also, this is only an illustration of the surface mount approach, which is not limited to semiconductor devices of the type shown.

Figure 1:
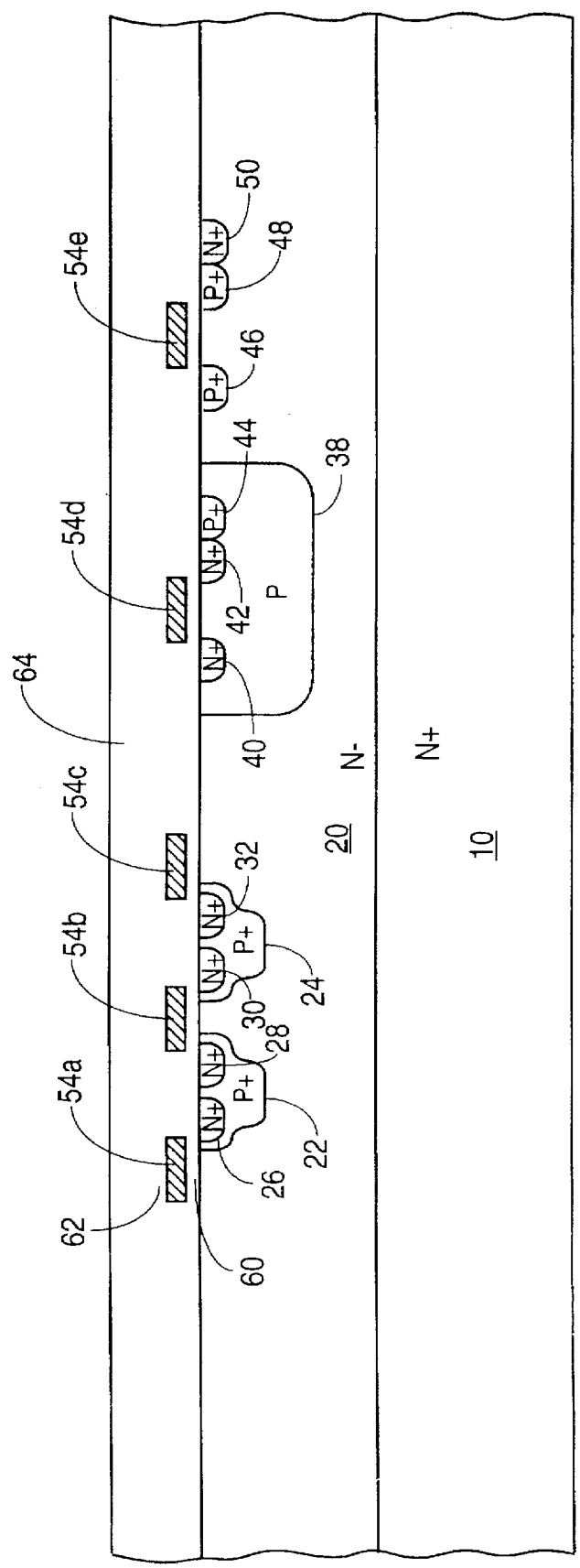
FIGS. 1 to 12 illustrate exemplary fabrication steps of the surface mount embodiment of the invention.

FIG. 1 shows initial steps in fabrication of this embodiment. FIG. 1 is conventional both in structure and fabrication as typically used for integrated circuits which include both power transistors and low voltage transistors on one chip. See U.S. patent application Ser. No. 07/948,276, filed Sep. 21, 1992, Hamza Yilmaz et al., entitled "BiCDMos Process Technology and Structure", incorporated by reference now abandoned, for an example of such a fabrication process. Shown in FIG. 1 is silicon (or other material) substrate 10 which is conventionally N+ doped, having formed on an upper portion thereof an epitaxial layer 20 which is conventionally N− doped. (It is to be understood that materials, dimensions, transistor structure, conductivity types, and other elements disclosed herein are illustrative only.)

Alternatively, epitaxial layer 20 is not present, and instead the active portion of the transistors are formed in a lightly doped substrate.

Substrate 10 is approximately 500 micrometers thick, and epitaxial layer 20 is 1 to 50 micrometers thick. Conventionally formed (in this illustrative embodiment) in epitaxial layer 20 are two "deep body" conventionally doped P+ regions 22 and 24. Formed respectively in body regions 22 and 24 are N+ source regions 26, 28, 30 and 32 each of which is conventionally doped. It is to be appreciated that in this embodiment P+ body regions 22 and 24 and the associated other doped regions are a part of a power portion of the integrated circuit, i.e. elements of power transistors.

Formed adjacent to regions 22 and 24 is P tub 38 which is conventionally doped. Formed in P tub 38 are N+doped regions 40 and 42. Also formed in epitaxial layer 20 are P+regions 46 and 48 which are similar in their doping level and structure to region 44, and N+ region 50 which is similar to regions 40 and 42. Formed immediately overlying the upper surface of epitaxial layer 20 is a conventional gate oxide layer 60 of e.g. silicon dioxide.

Formed conventionally overlying oxide gate layer 60 is a doped polysilicon gate electrode layer 54 including (as a result of a masking step) portions 54a, 54b, 54c and 54d and 54e which in this embodiment form the gate electrodes of various transistors.

Overlying gate electrode layer 54 is a second overlying (upper) insulative layer 62 formed of silicon dioxide and also covering the respective side edges of the gate electrodes 54a, . . . , 54e.

Overlying upper oxide layer 62 is a BPSG layer 64 (borophosphorsilicate glass) formed to a thickness of 0.5 to 1.5 micrometers and then conventionally reflowed to completely cover gate electrodes 54a, ..., 54e.

Figure 2:
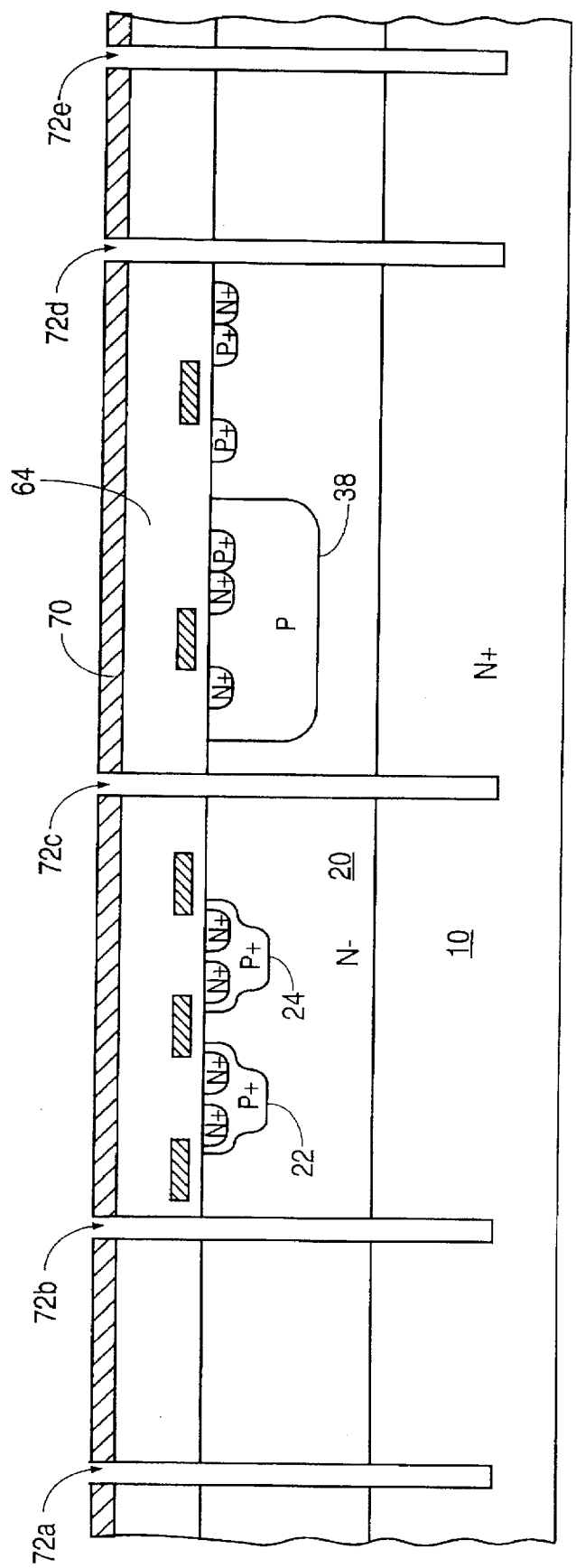

FIG. 2 shows subsequent processing with a conventional masking layer 70 formed overlying BPSG layer 64. Masking layer 70 is conventionally patterned and the underlying structure etched, with the etchant penetrating through epitaxial layer 20 and into silicon substrate 10 to define trenches 72a, 72b, 72c, 72d, and 72e. These trenches are 0.5 to 5 micrometers in width and 5 to 50 micrometers in depth. (The depth is relatively arbitrary for reasons discussed later and the width dimension is also not critical.) The trench etch is a conventional anisotropic process. It is to be understood that trenches 72a, ..., 72e as shown here in cross-section, would in a topside view interconnect so as to surround various portions of the integrated circuit, i.e. so as to surround the power transistor portion 22, 24 thereby separating this portion from the portion including P tub 38.

Then (not shown) the remaining portions of masking layer 70 are conventionally stripped off.

Figure 3:
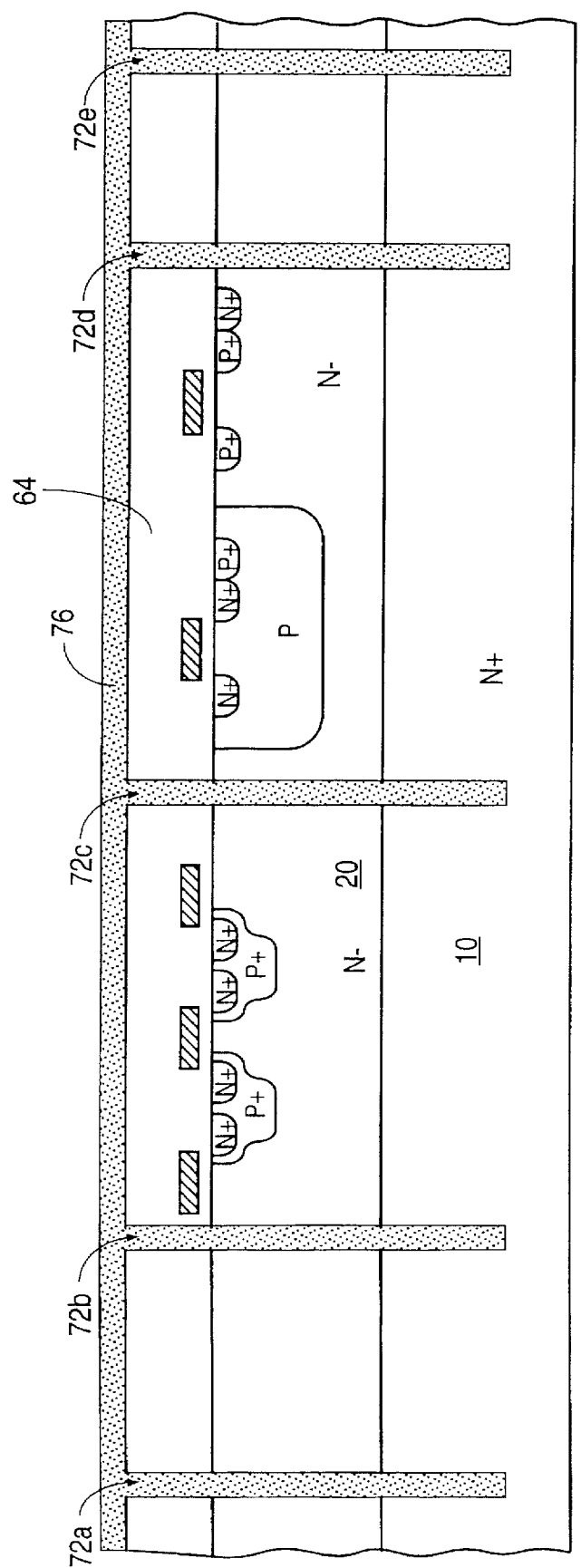

Next in FIG. 3, a material such as e.g. spun on glass (SOG) 76 is formed conventionally in each of trenches 72a, ..., 72e thereby filling each of these trenches, and also overlying the upper surface of BPSG layer 64, to a thickness of 1 to 2 micrometers. After formation of layer 76, this material is cured. Layer 76 here is the trench dielectric insulating material. Alternatives to SOG for layer 76 are CVD formed materials or plasma-enhanced formed CVD materials. In other embodiments, the trenches are lined with a layer of grown silicon dioxide and then filled with another material such as CVD oxide, polysilicon or nitride. (These are conventional processes for forming dielectric layers.)

Figure 4:
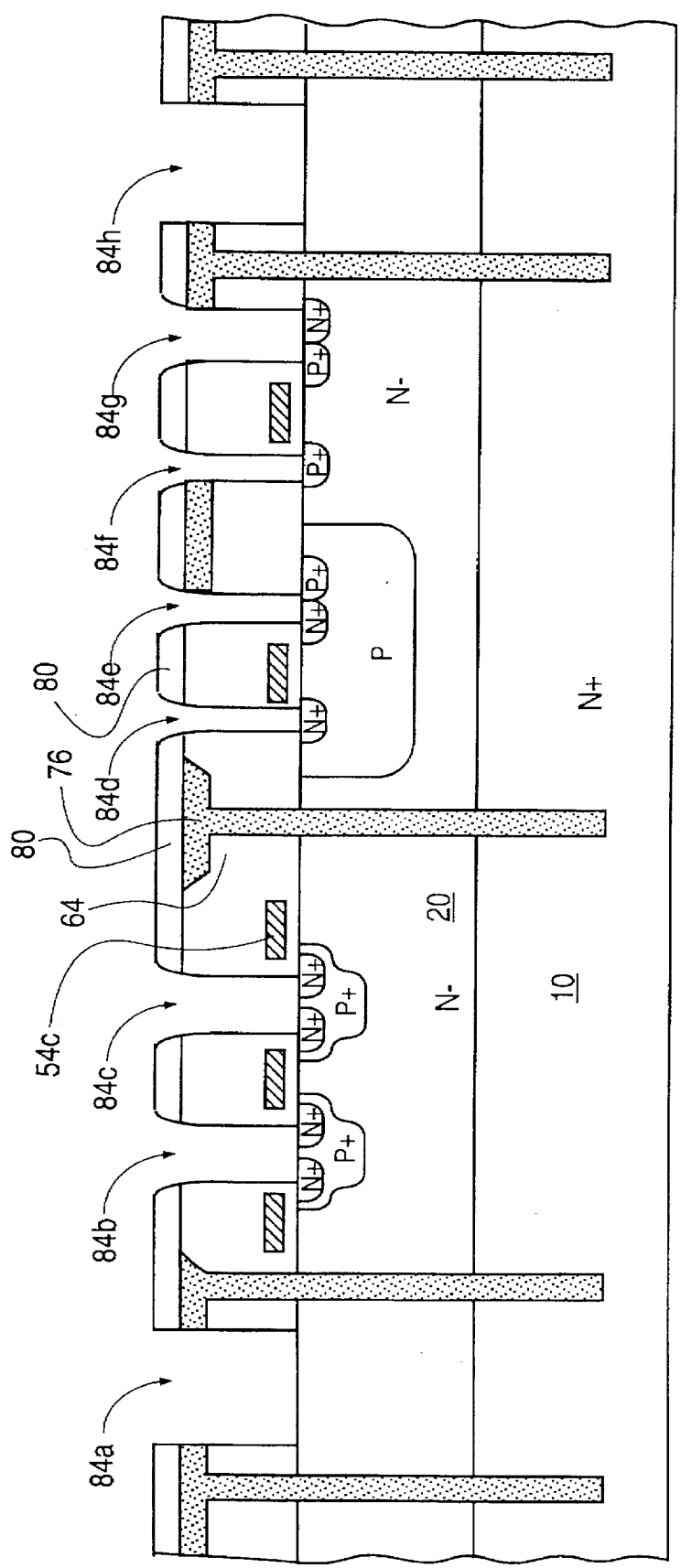

Next in FIG. 4, first an etch back step using e.g. CMP of the spun on glass layer 76 effectively removes those parts of layer 76 overlying the gate electrodes 54a, ..., 54e. An alternative to CMP is to apply a layer of photoresist then etch back the photoresist layer using a dry etch.

Following the etch back step, an LTO (low temperature oxide) layer 80 is deposited over the upper surface of the structure to a thickness of 0.5 to 2.0 micrometers. Following the LTO layer 80 deposition, an electrical contact mask layer (not shown) is applied overlying LTO layer 80. The contact mask layer is then conventionally patterned and the underlying layers etched, with the etch extending through LTO layer 80, through the remaining portions of spun on glass layer 76, and down to the principal surface of the layer 20, thus exposing portions of the principal surface of the layer 20 and defining contact openings 84a, ..., 84g.

Figure 5:
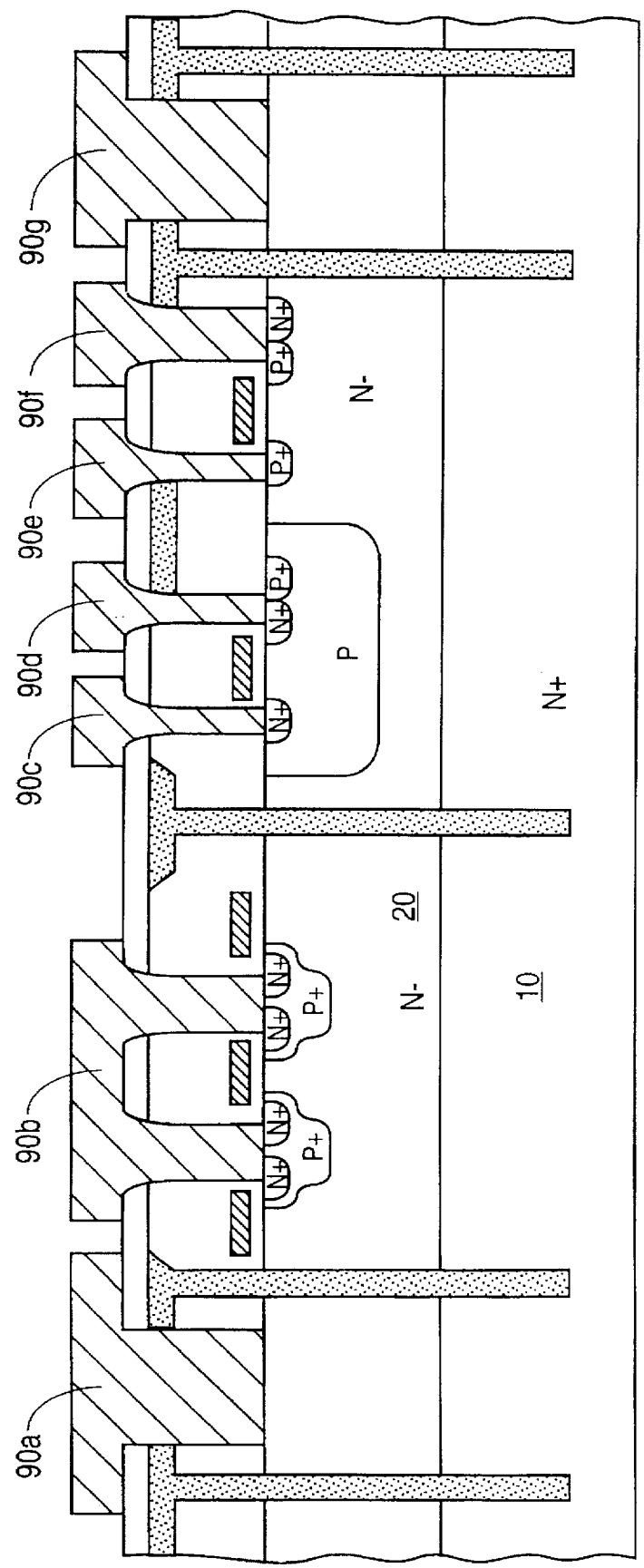

Next in FIG. 5, a layer of conductive material 90 (such as aluminum) is conventionally deposited over the surface of the substrate, filling the various contact openings 84a, ..., 84g and making contact with the underlying semiconductor regions formed in epitaxial layer 20. Then conductive layer 90 is conventionally masked, the masking layer is patterned, and layer 90 is etched to define electrical contacts 90a, ..., 90g.

Figure 6:
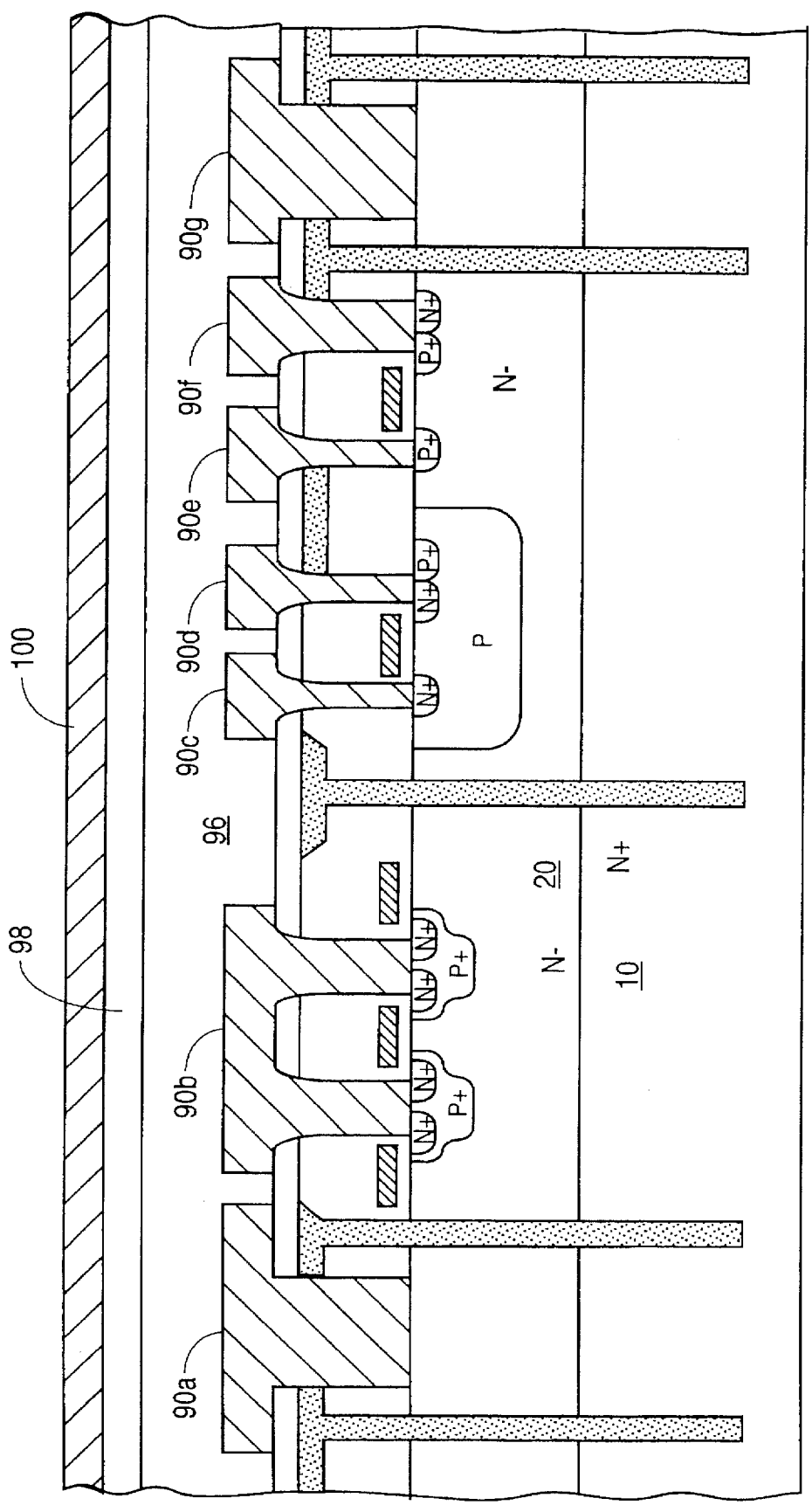

Then in FIG. 6 a conventional passivation layer of e.g. plasma nitride material is formed overlying electrical contacts 9oa, ..., 90g. Passivation layer 96 is 0.5 to 2.5 micrometers thick.

Overlying passivation layer 96, an epoxy material layer 98 is conventionally deposited 25 to 250 micrometers thick. This epoxy material 98 is e.g. a high performance epoxy resin composition that is thermally conductive (such as silver epoxy).

Next a "cap" (plate) 100 is affixed to epoxy layer 98 which is then cured, bonding cap 100 to passivation layer 96.

Cap 100 is about 500 micrometers thick and is e.g. undoped silicon. A single cap 100 covers the entire wafer which includes substrate 10 and epitaxial layer 20. Other bonding materials and processes other than epoxy may be used to affix cap 100. Cap 100 achieves thermal conductivity through epoxy layer 98 and also provide sufficient mechanical support for the substrate 10, epitaxial layer 20, and the active transistor regions and interconnect formed thereon.

Figure 7:
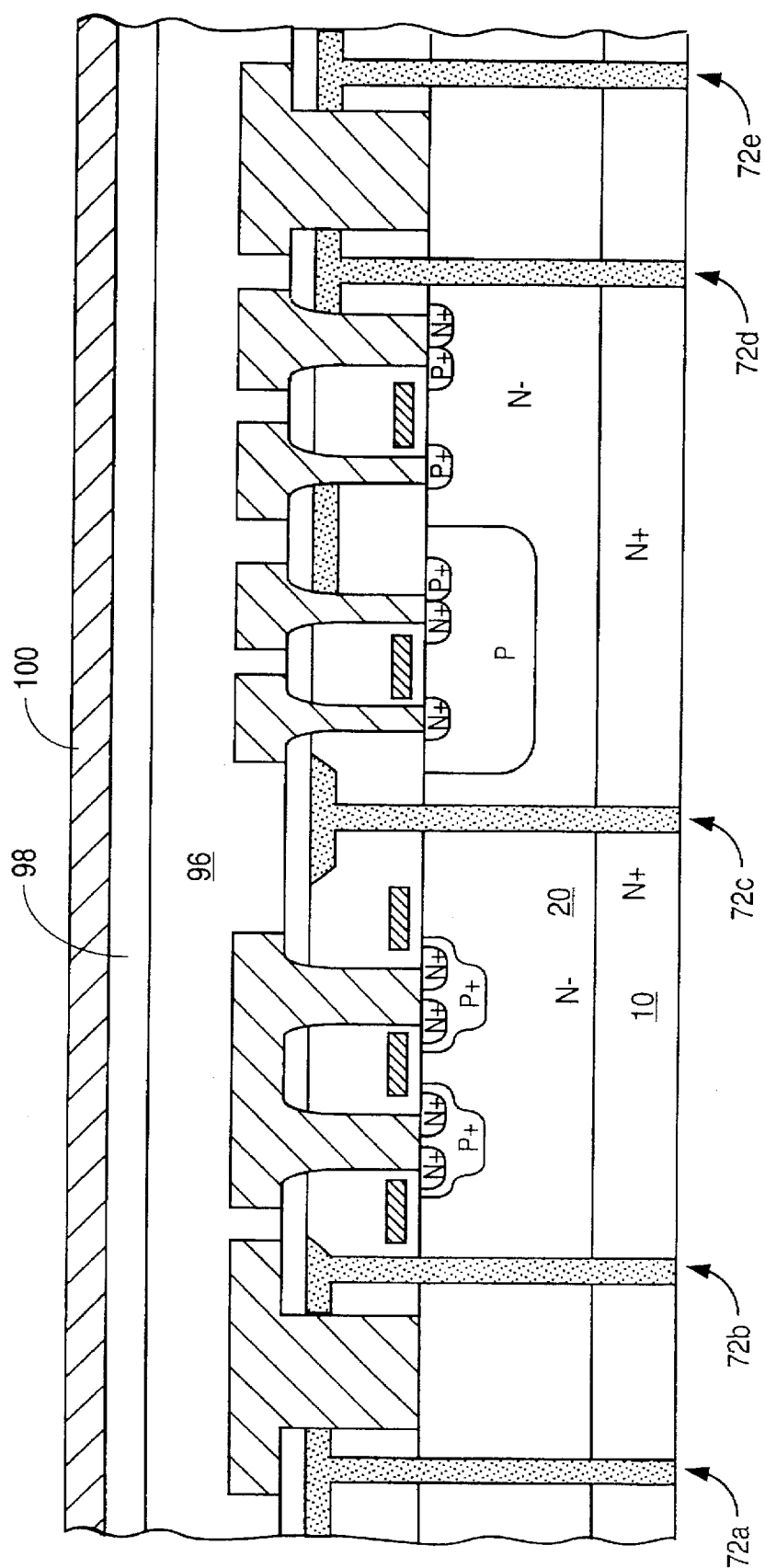

Next in FIG. 7, the backside surface of substrate 10 is partially removed by grinding, etching, or CMP (chemical-mechanical polishing) so that the total thickness of substrate 10 and/or epitaxial layer 20 is in the range of 5 microns to 100 microns. (Note that as stated above, epitaxial layer 20 is not present in some embodiments.) This is in contrast to the original total thickness of structures 10 and 20 of about 500 microns. (Again, these dimensions are illustrative and not limiting.) The goal is to reduce the thickness of substrate 10 to the minimum necessary for electrical functioning of the transistors formed therein. The removing step reduces the thickness of substrate 10 so that the bottom portion of each of trenches 72a, ..., 72e is exposed, and thereby the insulative material formed in each of these trenches is exposed at the backside surface of substrate 10. This achieves full electrical isolation of each portion of substrate 10. It is to be understood that in this case the affixation of heat sink cap 100 is done prior to the removing step to ensure that the substrate, after the removing step, remains in one integrated piece.

Figure 8:
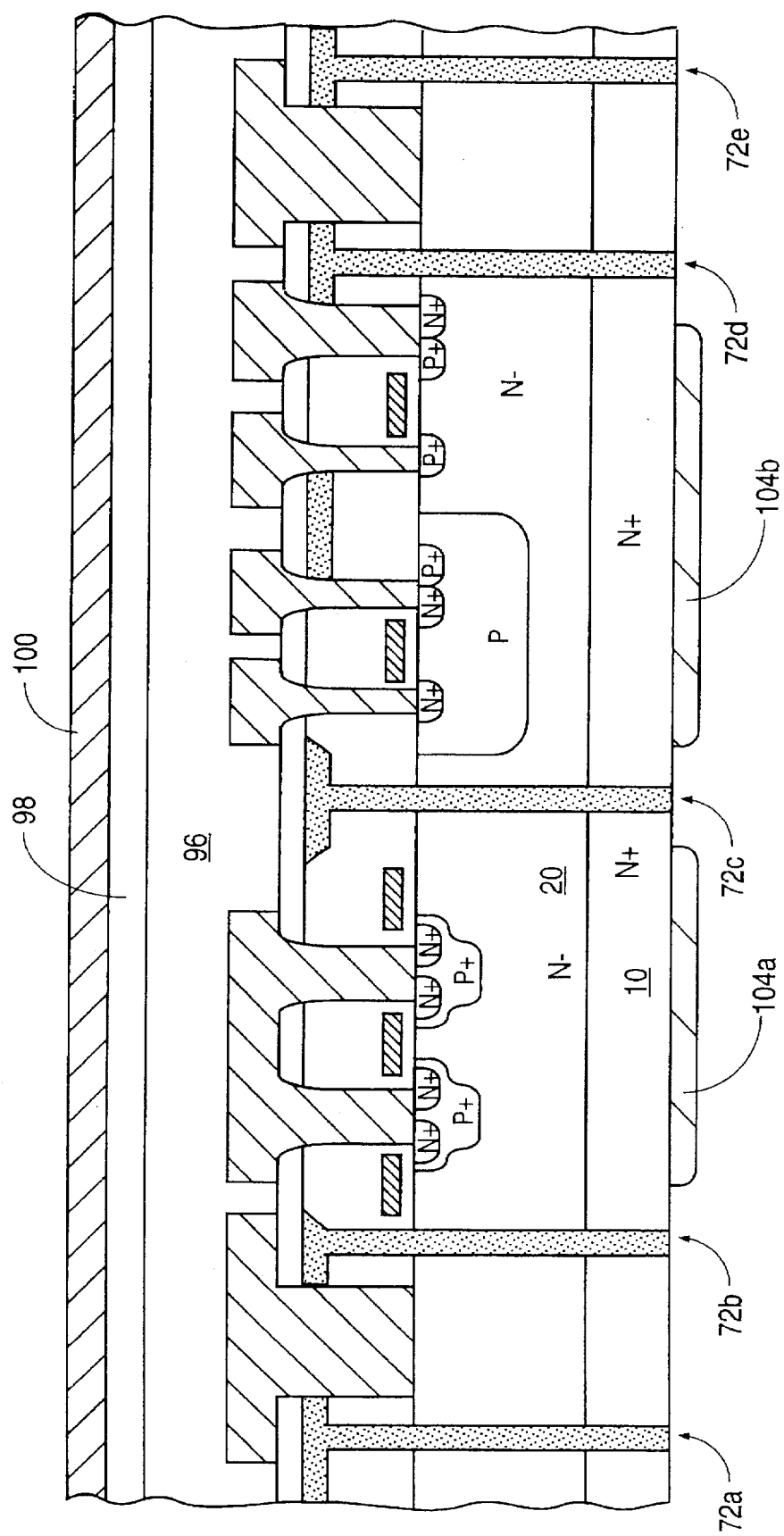
Figure 9:
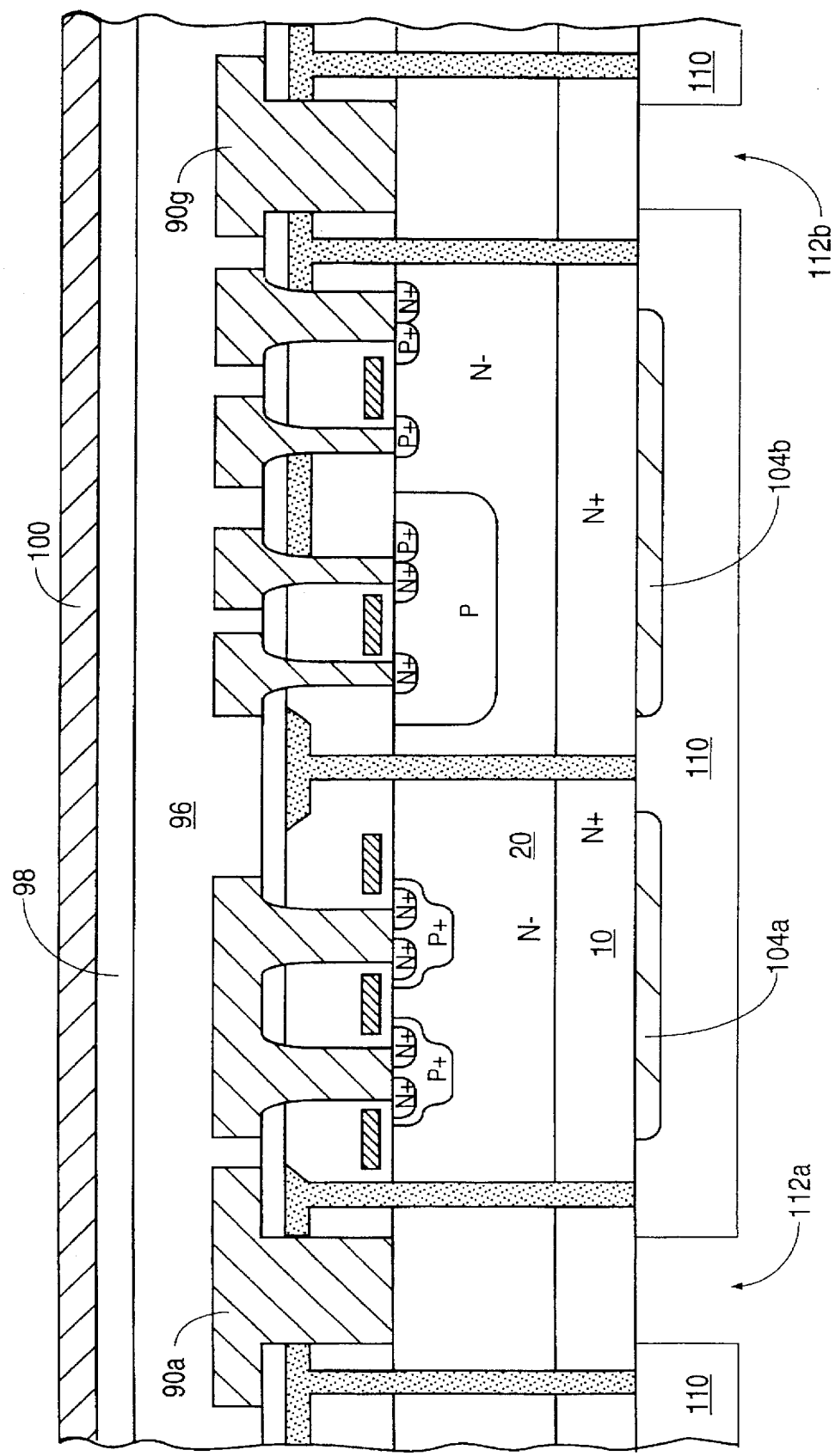

Next in FIG. 8, the backside surface of substrate 10 is metallized by a conventional sputtering or evaporative process to form a metal layer 104 (aluminum) thereon having a thickness of e.g. 0.15 to 1.5 micrometers. In some embodiments, conventional masking, dopant implantation, and annealing steps are used to form N+/P+ contacts on the backside surface of substrate for contact to metal layer 104. Then metal layer 104 is conventionally covered with a mask layer, the mask layer is patterned, and metal layer 104 then etched to define contact pads 104a, 104b on the backside surface of substrate 10. Each of contact pads 104a, 104b is associated with a selected portion of the integrated circuit die as defined by the trenches 72a, ..., 72e, of course each portion of the die need not have a contact pad; contact pads 104a, 104b are only provided to those portions of the die which require same. (It is to be understood that some types of 35 transistors would not require backside contacts.) Next in FIG. 9, a protective/passivation layer 110 is deposited on the backside surface of substrate 10 overlying contact pads 104a and 104b. Then layer 110 is conventionally patterned to define openings 112a and 112b. Each opening 112a and 112b is associated with a particular electrical contact 90a, 90g on the upper side surface of epitaxial layer 20 as shown (or on the substrate if no epitaxial layer is present).

Figure 10:
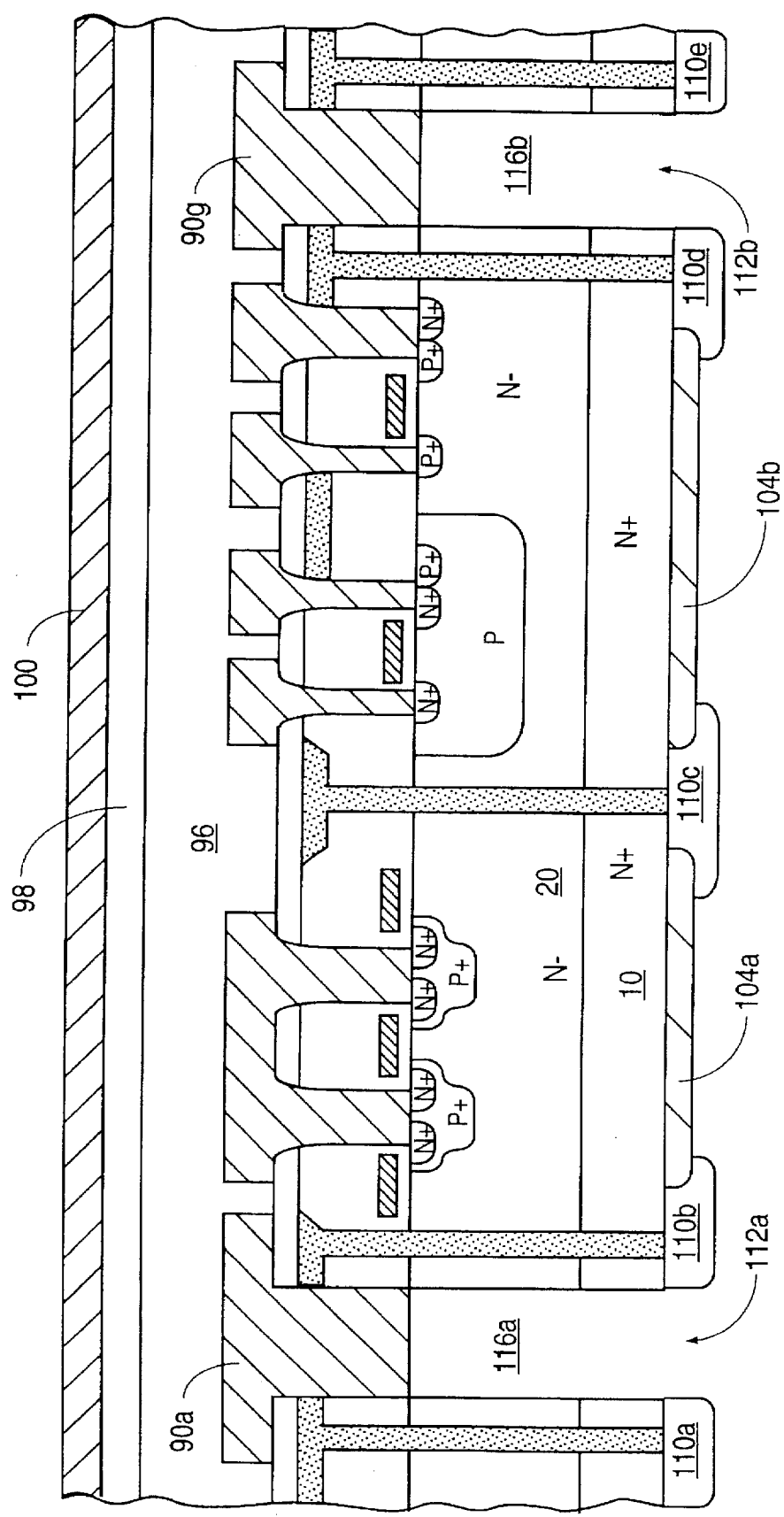

Next in FIG. 10, a deep silicon etch is undertaken through openings 112a and 112b to define vias 116a, 116b extending through substrate 10 and/or epitaxial layer 20 to expose the underside portions of electrical contacts 90a, 90g. This deep silicon etching step uses a wet or wet/dry or dry etching technique.

Vias 116a, 116b need only be wide enough to establish good electrical paths to contacts 90a, 90g and otherwise their dimensions in terms of width are not critical; neither is their cross-sectional shape critical. Then as shown in FIG. 10 the remaining portions of mask layer 110 may be conventionally stripped off or kept as a passivation layer 110a, 110b, 110c, 110d, 110e using an additional masking step.

Figure 11:
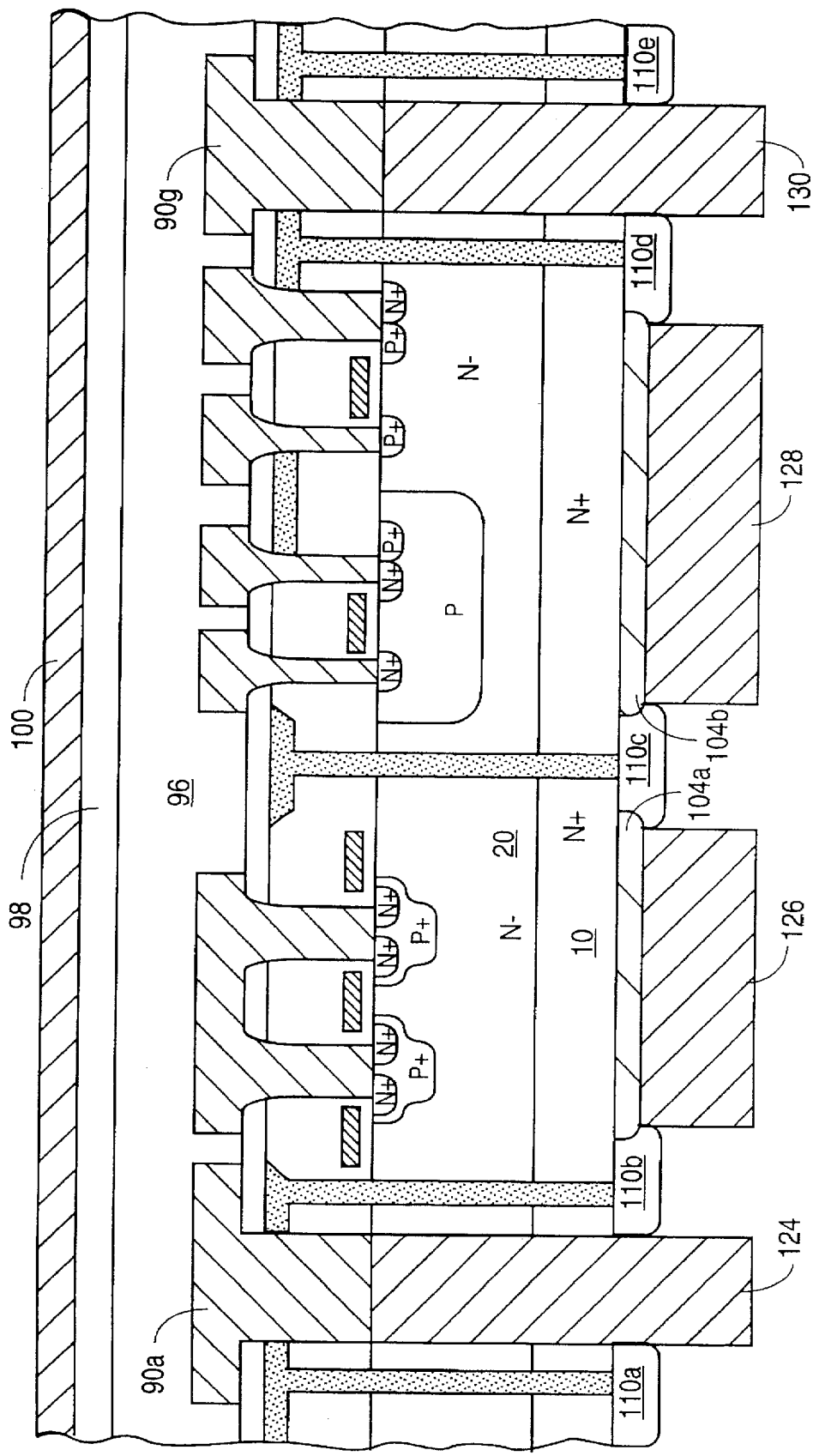

Next in FIG. 11 (showing the embodiment with passivation layer 110a, ..., 110e), vias 116a and 116b are filled by a plating step (electrodeposition) with a solderable metal (e.g. nickel, gold, copper) to define posts 124, 130 extending therefrom. In the same electrodeposition step, metal posts 126, 128 are deposited on metal contacts 104a, 104b.

Alternatively, posts 124, 126, 130 are formed screen printing the desired type of metal on the front side 90a, 90g and backside 104, 104b interconnection leads to establish the desired thickness for the surface mount posts. The diameter of the surface mount posts may vary, depending on the particular application.

Figure 12:
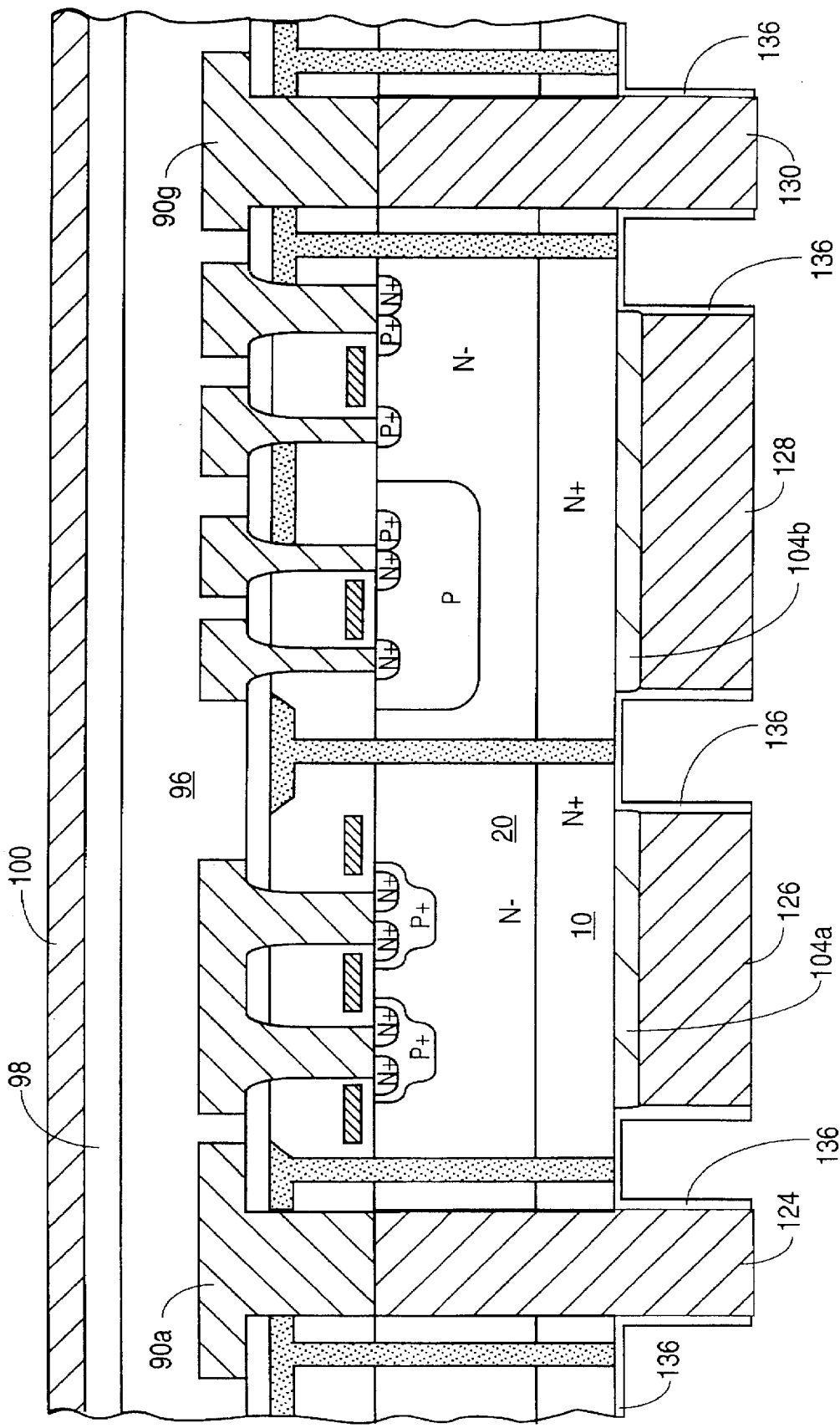

Next in FIG. 12, an optional passivation layer 136 is deposited (in those embodiments where layer 110 is stripped off in FIG. 10) over all exposed surfaces of the surface mount posts 124, 126, 128 and 130 to a thickness of 0.8 to 1.2 micrometers. (This layer 136 is not needed if passivation layer 110a, . . . , 110e is used as in the embodiment of FIGS. 10 and 11). Passivation layer 136 is e.g. polyimide or low temperature oxide.

Then portions of passivation layer 136 are removed (by masking and etching or other means, for instance CMP) from the bottom surfaces of each surface mount post 124, 126, 128, 130, so as to leave the post bottom surfaces exposed for soldering, such as to a printed circuit board. The height of the surface mount posts extending from the lower backside surface of substrate 10 is conventionally 10 to 300 micrometers, or any other height as needed depending on the mounting application.

In FIG. 12 all of the electrical interconnections to outside of the chip are provided on the backside surface of substrate 10 by the surface mount posts 124, 126, 128 and 130.

Subsequently (not shown) the wafer is scribed into individual integrated circuit die along predescribed scribe lines which are for instance adjacent to dielectrically filled trenches. Thus as a result of the scribing step, the various integrated circuit die are already packaged by the top side cap 100 and the bottom side passivation layer 136; hence no further packaging is needed.

Flip Chip Embodiment

Figure 13:
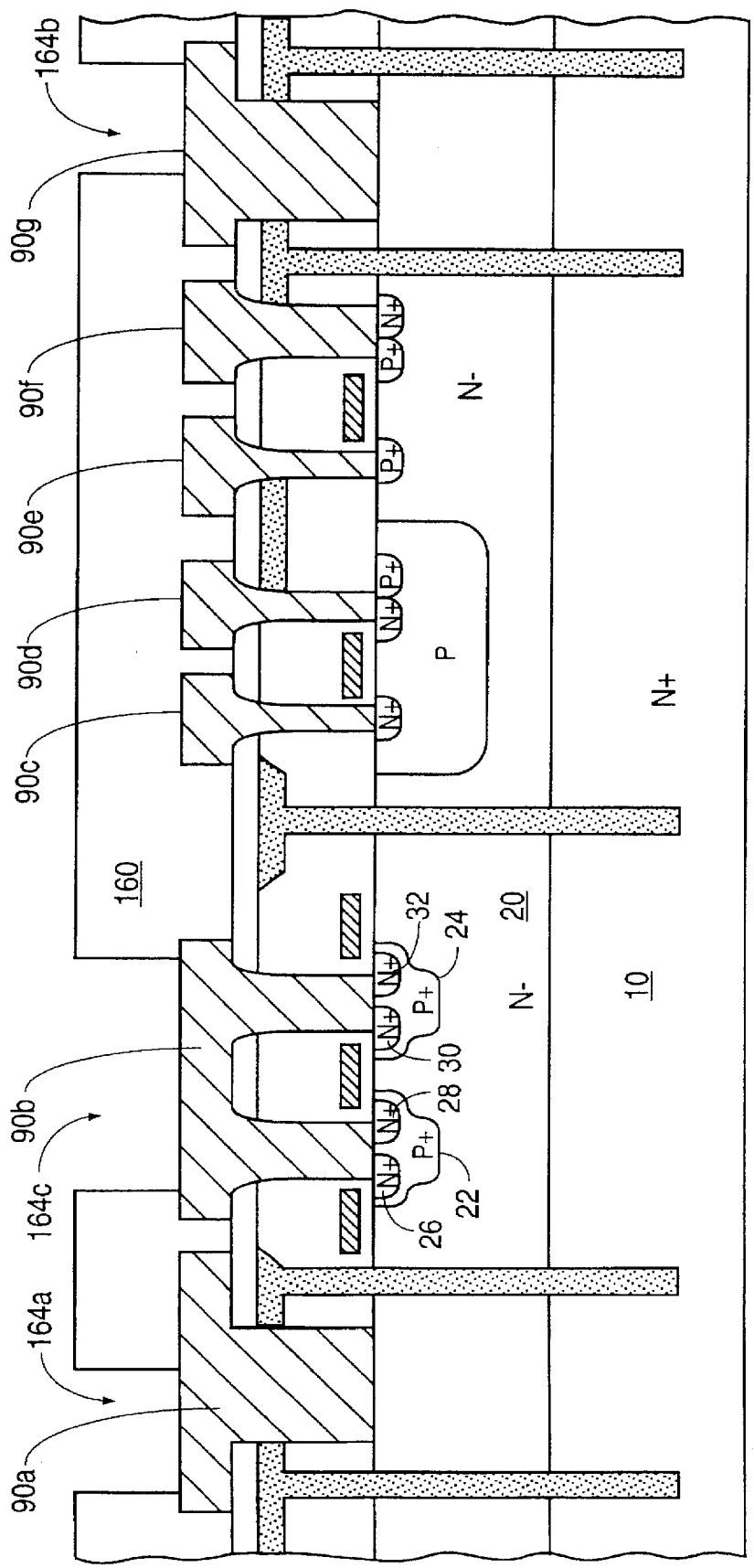
FIGS. 13 to 17 illustrate exemplary fabrication steps of the flip chip type embodiment of the invention.

In the flip chip embodiment, the initial processing steps are identical to those shown in FIGS. 1 to 5 for the surface mount embodiment, resulting in the structure of FIG. 13. Again, the flip chip embodiment is not limited to semiconductor devices of the type shown. The structure of FIG. 13 is identical to that of FIG. 5, except that in FIG. 13 the next step is that passivation layer 160 (which is similar in material and thickness to passivation layer 96 in FIG. 6) is masked using a mask layer (not shown) which is patterned, with subsequent etching to define contact openings 164a, 164b, 164c therethrough. Contact openings 164a, 164b, 164c expose respectively a portion of the underlying electrical contacts 90a, 90g, 90b. The goal in this embodiment is to define both substrate frontside and backside electrical contacts; openings 164a, 164b define the frontside contact openings to the substrate and opening 164c defines the frontside contact opening to source and body regions 22, 24, 26, 28, 30, 32.

Figure 14:
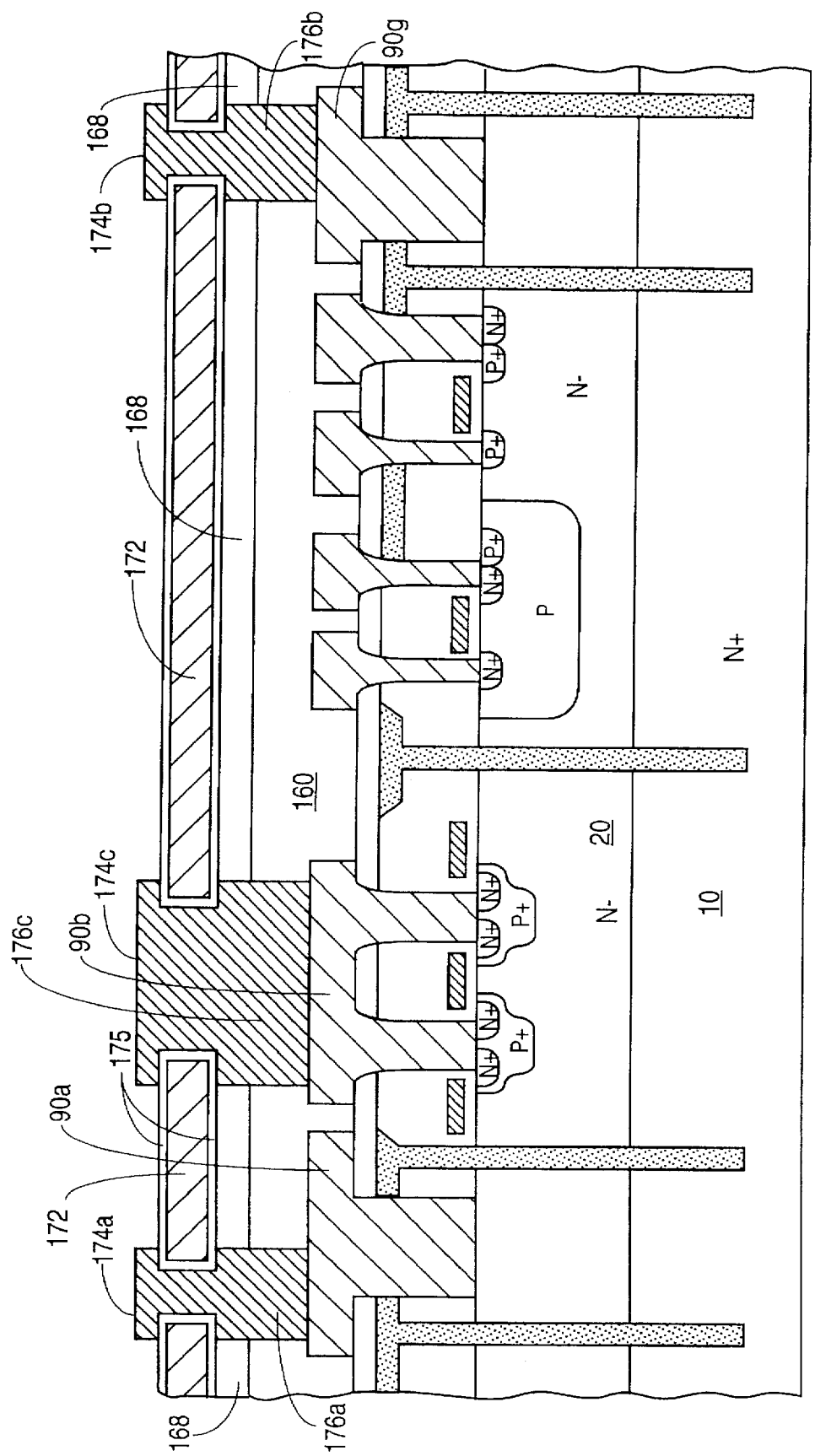

Next in FIG. 14, heat sink cap 172 (formed e.g. of silicon) is provided, having formed thereon (prior to assembly to the substrate 10) metal (aluminum or a solderable material) interconnect structures 176a, 176b, 176c. Interconnect structures 176a, 176b, 176c include interconnect lines on the surface of cap 172 which faces contacts 90a, 90g, 90b; these interconnect lines have a thickness of 10 to 100 micrometers. Silicon heat sink cap 172 is electrically insulated on all surfaces by e.g. oxide dielectric layer 175. Interconnect structures 176a, 176b, 176c are then e.g. conventionally soldered or sintered to underlying contacts 90a, 90g, 90b. This electrical contact can be provided alternatively by any conventional technique.

Cap 172 is attached to the underlying structure by a high performance thermally conductive epoxy resin layer 168 formed on passivation layer 160 (or on the underside of cap 172) to a final thickness of 25 to 250 micrometers. Epoxy layer 168 is prevented from fouling the electrical interconnections (between elements 176a, 176b, 176c and 90a, 90g, 90b) by tasking and etching the epoxy layer 168 or by polishing it away from the interconnections. For instance, epoxy layer 168 is initially formed in a thick layer covering structures 176a, 176b, 176c then etched back to expose the ends of structures 176a, 176b, 176c using a wet or dry etch.

It is to be understood that cap 172 serves as a heat sink and supports contact structures 176a, 176b, 176c which connect through vias extending through cap 172 to form interconnect contacts 174a, 174b, 174c on the opposite surface of cap 172. These interconnect contacts 174a, 174b, 174c are suitable for attachment to an underlying supporting conventional flip chip-type back plate (not shown) providing mechanical support and electrical bonds thereto.

Figure 15:
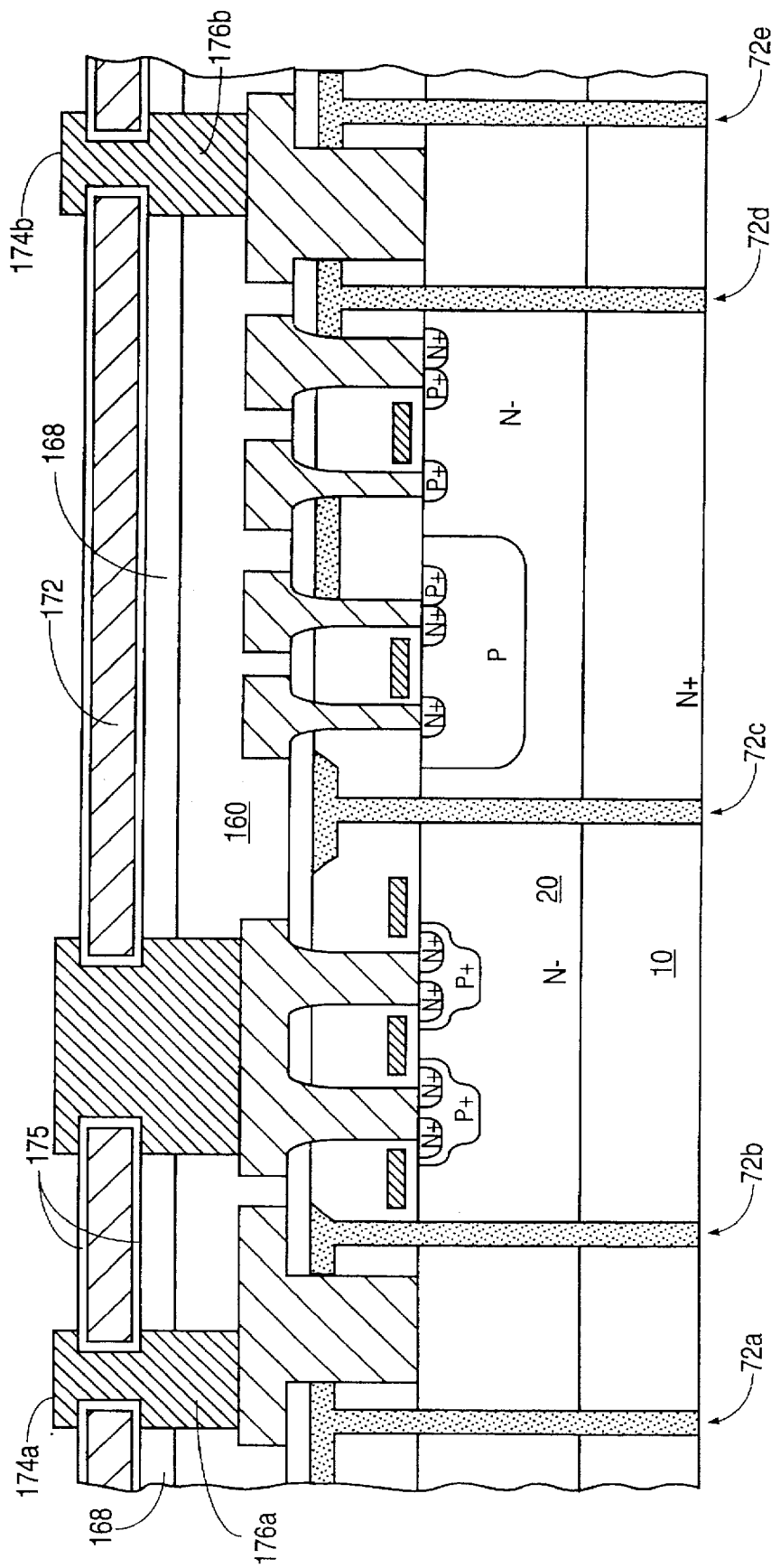
Figure 16:
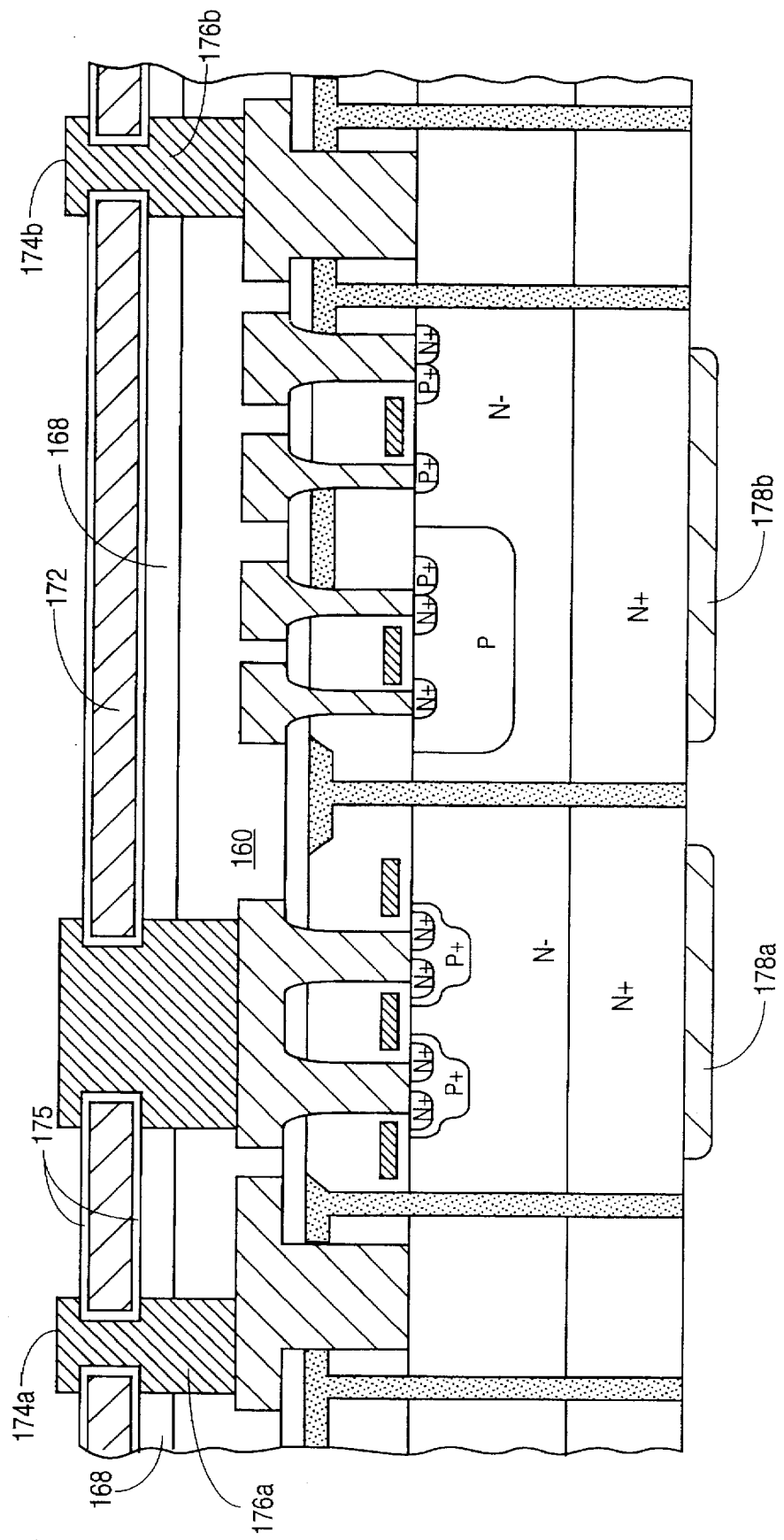

Next in FIG. 15, (similar to FIG. 7) the backside surface of substrate 10 is polished or etched away to expose the lower portions of dielectrically insulated trenches 72a, . . . , 72e. Again, the total thickness of substrate 10 and epitaxial layer 20 is minimized by this removing step to that needed for proper electrical functioning. Next in FIG. 16, backside contacts 178a, 178b are formed, similar to contacts 104a, 104b in FIG. 8.

Figure 17:
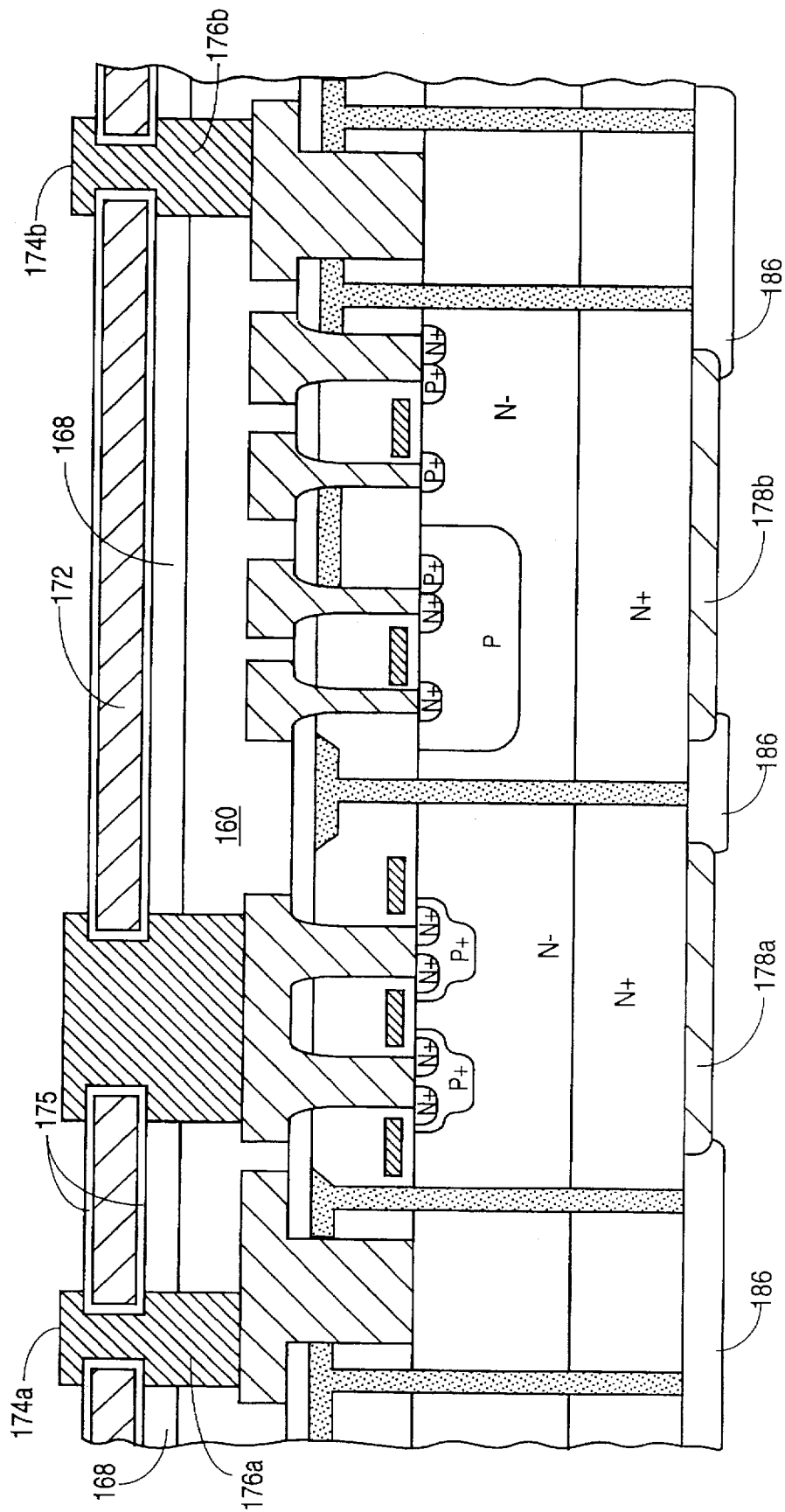

Next in FIG. 17, backside passivation layer 186 is deposited to a thickness of 0.5 to 2.5 micrometers using oxide or nitride or an oxide-nitride "sandwich" material over the backside surface of substrate 10 and initially over contact areas 178a and 178b, but is then removed from the exposed surfaces by use of a mask which is then patterned, and etching away of the unneeded portions of passivation layer 186. This exposes the bonding area of the power device drain contact 178a and a collector type drain contact 178b if desired. (Again the use of the backside contact depends on the nature of the associated semiconductor devices). Thus the flip chip configuration of FIG. 17 provides both frontside substrate electrical contacts 174a, 174b, 174c through cap 172 and also backside contacts 178a, 178b. The frontside leads are beam lead structures, tunnel lead structures or any others as suitable, to the transistors.

Again, after the steps of FIG. 17, the entire wafer is conventionally scribed along predetermined scribe lines (not shown); thus as a result of scribing the chip is complete (packaged), advantageously without any need for further packaging steps.

The above description is illustrative and not limiting; it will be understood by one of ordinary skill in the art that further modifications will be apparent in view of this disclosure, and fall within the scope of the appended claims.

We claim:

1. A method of forming an integrated circuit, comprising the steps of:

providing a semiconductor substrate having a principal surface;

forming a plurality of semiconductor devices in the substrate;

forming a plurality of trenches in the substrate extending from the principal surface thereof into the substrate to a particular depth;

forming a layer of insulating material in each of the trenches;

forming a pattern of conductive lines overlying the principal surface and in electrical contact with the devices;

bonding a thermal conductive plate to the substrate and overlying the principal surface thereof; and removing a portion of the substrate from a backside surface thereof opposing the principal surface, thereby exposing at least a bottom part of each of the trenches.

2. The method of claim 1, further comprising the steps of:

forming a conductive layer on the backside surface; and patterning the conductive layer into a plurality of contact regions, each contact region being in contact with a selected portion of the backside surface as defined by the plurality of trenches.

3. The method of claim 1 wherein the step of removing leaves a remaining thickness of the substrate of less than about 300 μm.

4. The method of claim 1, further comprising the step of forming a second pattern of conductive lines on a surface of the plate prior to the step of bonding;

wherein the step of bonding comprises electrically contacting portions of the second pattern to portion s of the first pattern.

5. The method of claim 1, further comprising the step of forming a protective layer overlying the substrate prior to the step of bonding;

wherein the step of bonding comprises applying an adhesive to the protective layer.

6. The method of claim 1, further comprising the steps of:

forming a plurality of vias extending from the backside surface to the principal surface of the substrate, after the step of removing;

providing conductive material in each of the vias, the conductive material in each via being in electrical contact on the principal surface with a portion of the pattern of conductive lines, and the conductive material in each via forming an electrical contact on the backside surface.

7. The method of claim 6, wherein the step of providing conductive material comprises forming a layer of the conductive material on the backside surface, and further comprising:

forming the layer of conductive material into a plurality of posts extending outward from the backside surface, each post being electrically connected to the conductive material in one of the vias.

* * * * *

UNITED STATES PATENT AND TRADEMARK OFFICE
CERTIFICATE OF CORRECTION

PATENT NO.    : 5,753,529
ISSUE DATE    : May 19, 1998
INVENTOR(S)   : Mike F. Chang et al.

It is certified that error appears in the above-identified patent and that said Letters Patent is hereby corrected as shown below:

At column 5, line 59, delete "9oa" and substitute --90a--.

At column 6, line 44, the word "Next" should begin a new paragraph.

At column 8, line 11, delete "tasking" and substitute --masking--.

At column 9, line 24, delete "portion s" and substitute --portions--.

Signed and Sealed this

Thirtieth Day of November, 1999

Attest:

Q. TODD DICKINSON

*Attesting Officer*          *Acting Commissioner of Patents and Trademarks*